(12) United States Patent
Bond et al.

(10) Patent No.: US 9,235,747 B2
(45) Date of Patent: Jan. 12, 2016

(54) INTEGRATED LEADFRAME AND BEZEL STRUCTURE AND DEVICE FORMED FROM SAME

(75) Inventors: Robert Bond, Oakland, CA (US); Alan Kramer, Berkeley, CA (US); Giovanni Gozzini, Berkeley, CA (US)

(73) Assignee: APPLE INC., Cupertino, CA (US)

( * ) Notice: Subject to any disclaimer, the term of this patent is extended or adjusted under 35 U.S.C. 154(b) by 2116 days.

(21) Appl. No.: 12/324,869

(22) Filed: Nov. 27, 2008

(65) Prior Publication Data

US 2010/0127366 A1    May 27, 2010

(51) Int. Cl.
*H01L 23/495* (2006.01)
*G06K 9/00* (2006.01)

(52) U.S. Cl.
CPC ...... *G06K 9/00026* (2013.01); *H01L 23/49541* (2013.01); *H01L 23/49548* (2013.01); *H01L 23/49551* (2013.01); *H01L 2224/48091* (2013.01); *H01L 2224/48247* (2013.01); *H01L 2224/49171* (2013.01); *H01L 2924/10253* (2013.01)

(58) Field of Classification Search
CPC ............ H01L 23/49541; H01L 23/49548; H01L 23/49551
See application file for complete search history.

(56) References Cited

U.S. PATENT DOCUMENTS

| | | | | |
|---|---|---|---|---|
| 4,577,214 | A | * | 3/1986 | Schaper .................. 257/691 |
| 5,862,248 | A | * | 1/1999 | Salatino et al. ........... 382/124 |
| 6,078,099 | A | | 6/2000 | Liu et al. |
| 6,331,452 | B1 | | 12/2001 | Gall |
| 6,512,381 | B2 | | 1/2003 | Kramer |
| 6,683,971 | B1 | | 1/2004 | Salatino et al. |
| 6,686,227 | B2 | | 2/2004 | Zhou et al. |
| 2006/0148127 | A1 | | 7/2006 | Ong et al. |
| 2008/0230876 | A1 | | 9/2008 | Camacho et al. |

FOREIGN PATENT DOCUMENTS

| | | |
|---|---|---|
| EP | 1187207 | 3/2002 |
| JP | 2001056204 | 2/2001 |
| JP | 2002246488 | 8/2002 |
| JP | 2006108359 | 4/2006 |

* cited by examiner

*Primary Examiner* — Amar Movva
(74) *Attorney, Agent, or Firm* — Allen, Dyer, Doppelt, Milbrath & Gilchrist, P.A.

(57) ABSTRACT

An integrated leadframe and bezel structure includes a planar carrier frame, a plurality of bonding leads, a die pad region, and a bezel structure. The bezel structure includes a bending portion shaped and disposed to facilitate a portion of said bezel structure being bent out of the plane of said carrier frame. A sensor IC may be secured to the die pad region, and wire bonds made to permit external connection to the sensor IC. The bezel structure includes portions which are bent such that their upper extent is in or above a sensing surface. The assembly is encapsulated, exposing on the top surface part of the bezel portions and the upper surface of the sensor IC, and on the bottom surface the contact pads. Two or more bezel portions may be provided, one or more on each side of the sensor IC.

27 Claims, 11 Drawing Sheets

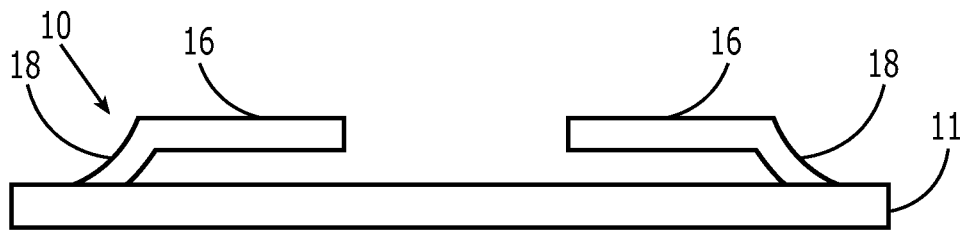
FIG. 3A
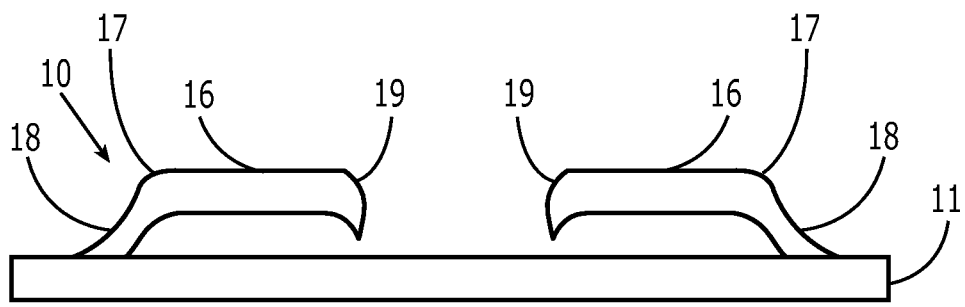
FIG. 3B
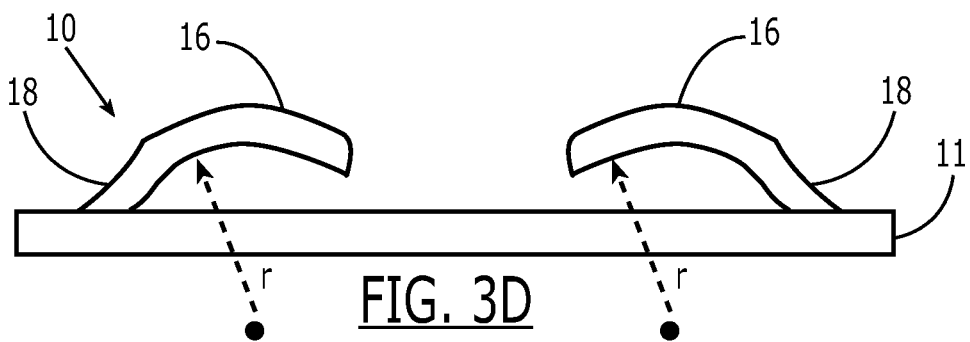
FIG. 3C
FIG. 3D

INTEGRATED LEADFRAME AND BEZEL STRUCTURE AND DEVICE FORMED FROM SAME

BACKGROUND OF THE INVENTION

1. Field of the Invention

The present invention relates to integrated circuit packaging, and more specifically to a leadframe structure and method of using same which provides an integrated leadframe and exposed bezel portion for receiving a user's fingertip or the like.

2. Description of the Prior Art

The present invention lies at the crossroads of two different technologies. The first of these is integrated circuit (IC) packaging. The second is silicon fingerprint sensors. We look first at IC packaging. Historically, the number of devices formed on an IC die has increased dramatically from year to year. Advancements in both the design and layout of devices carried by the IC die as well as in designs for making external connections to those devices have supported the increases in device count. A typical IC assembly includes the die, often a body of a semiconducting material such as silicon, having interconnected electronic elements such as transistors, resistors, capacitors, interconnections, etc. formed thereon. The die are typically quite small, with correspondingly small contact pads, necessitating use of a secondary structure to make practical electrical connections between the die and a printed circuit board (PCB) or other body to which the IC is attached for use. Such secondary structures include leadframes, chip carriers, and the like. In common applications, an IC die is physically bonded to a leadframe, and fine wires make the electrical interconnections between the bonding pads of the IC die and the bonding leads of the leadframe. The leadframe in turn presents pads or pins which make the final electrical connection to the next level PCB or the like.

The IC die, connection wires, and bonding leads of the leadframe are typically encapsulated in a non-conductive structure or encapsulation, such as resin or plastic. In certain embodiments, a portion of the leadframe extends beyond the extent of the encapsulation for the external connection points to the leadframe and thereby to the IC. In other embodiments the leadframe is etched to have at least two different thicknesses. The regions having the lesser of the thicknesses become fully encapsulated in the encapsulation material, while the regions having the greater thickness protrude beyond the encapsulation material, providing external contact pads.

The encapsulation provides protection from both mechanical (e.g., impact and scratch) and electrical (e.g., electrostatic discharge) damage. The encapsulation material is nonconductive, providing internal electrical isolation as well as isolating the die therein from unwanted external electrical contact.

Manufacturing the encapsulated die and leadframe combination is most commonly accomplished by placing the die, pre-mounted to a die pad portion of the leadframe, within the cavity of a mold, and injecting encapsulation material into the cavity. By sizing and properly engineering the mold, the encapsulation material is applied to a desired thickness and in desired regions around the leadframe and IC die.

We turn next to silicon fingerprint sensors. Devices designed for sensing the pattern of a fingerprint fall into several categories based on the type of sensor they employ, such as optical, thermal, capacitive, and so on. Within these categories, some require a user's finger be in direct contact with a portion of the sensor (or a coating applied thereover) such as in the case of capacitive sensors, while others require that the finger be positioned spaced apart from the sensor surface (though often in direct contact with another surface such as a glass or plastic optical platen or lens surface), such as in the case of optical sensors. We are primarily concerned in this disclosure with the category of direct contact sensor devices, although some aspects of the present invention may be usefully applied to non-direct-contact sensor devices, as will be appreciated by one skilled in the art.

In one example of a direct contact silicon fingerprint sensor device, a capacitor plate is formed just below the surface of an IC sensor die. Typical IC fabrication techniques are employed to form the sensor die. A fingertip is placed on the surface of the sensor die. The skin surface at the ridges of the fingerprint will therefore be located closer to the capacitor plate than the skin surface at the valleys. The skin surface is established as one plate of a capacitor, and the buried plate as another. Thus, the distance between the capacitor plates varies as between ridges and valleys of the fingerprint pattern. This variation in distance results in a variation in capacitance, which may be measured for regions (i.e., pixels) of the fingertip and used to create a 3-dimensional representation of the fingerprint contours and pattern (where distance corresponds to pixel grayscale value).

Direct contact capacitive sensor (and other direct-contact sensor technologies such as thermal) devices require that the sensed portion of a user (e.g., the fingertip) be positioned very close to, if not touching the sensor device. For this reason, sensor devices for direct contact fingerprint sensing are often packaged in encapsulation material such that a portion of the surface of or over the IC sensor die is exposed (i.e., the mold structure is such that the encapsulation material is prevented from forming over a sensing portion of the IC die). In some applications one or more thin protective coatings such as polyamide or epoxy are applied to the sensor and or IC surface at the wafer level (prior to packaging), in other applications such thin protective coatings can be applied within the packaging process itself (covering the silicon die with a thin layer of encapsulation material to form an outermost sensing surface), and in still other applications no additional protective coating (beyond the standard passivation layer typically applied as one of the final steps of silicon wafer manufacturing) is used and the silicon sensor surface (e.g., silicon nitride passivation layer) is actually exposed for contact. Whether thinly covered with additional protective layers beyond the one typical passivation-based protective layer or not, and whether any such protective layers are in place prior to encapsulation or formed as part of the encapsulation process, such devices are referred to herein as exposed die sensor packages. The sensing surface is the uppermost surface of such exposed die sensor packages.

There are two further subcategories of direct-contact silicon fingerprint sensor devices—area sensors and strip sensors. An area sensor is essentially a two-dimensional array of sensor pixels over which a user places a finger. Through a raster or similar scanning process, the array of sensor pixels are sequentially activated, sensing takes place, and the results read out for processing. No motion of the finger is required. Indeed, the finger must be kept relatively motionless during the sensing phase to obtain undistorted results. A strip sensor is essentially a one-dimensional array (or an array with a much greater width than length), over which a user swipes a finger. The sensor may typically be as wide as the width of an average fingertip. For example, such a sensor may be in the range of 5-10 mm in width, and typically measures 0.1-0.4 mm or 2-8 sensor rows in length. As the finger passes over the sensor, sensing takes place for a "strip" of the fingerprint equal in length to the length of the sensor array (which is again many fewer pixels than the width). Each image is an accurate representation of the structure of a small essentially 1-dimensional strip of the overall 2-dimensional fingerprint pattern. A complete 2-dimensional image of the fingerprint pattern is then composed by software from analysis and normalization of the data from the individual essentially 1-dimensional strips. A very compact sensor is thereby provided, which finds use in many devices such as portable (notebook) computers, telephones (such as cell phones), personal digital assistants (PDAs), etc.

There are a number of existing techniques for producing an exposed die sensor package. Each typically include disposing the die and a contact structure within a mold body, and injecting resin or plastic into the mold to encapsulate the die. According to one technique, disclosed in U.S. Pat. No. 6,686,227, which is incorporated herein by reference, a die may be mounted to an insulative substrate (such as a fiberglass panel), with bonding wires making electrical connection between the die and substrate. The die and substrate are then placed in a mold body, such that the mold body clamps the substrate to hold the structure in place. A seal, located either on the mold or on the substrate then serves to block any introduced encapsulation material injected into the mold from being applied to the region of the die which is desirably to be exposed. Upon removal from the mold body, the die and substrate are encapsulated in the protective encapsulation material, with an exposed portion of the die provided for the sensing operation.

Another technique, disclosed in U.S. Pat. No. 5,862,248, which is incorporated herein by reference, provides discrete leads in a molding process resulting in an exposed die with a dual-in-line package (DIP) type lead arrangement. According to this technique, a die is attached to a leadframe and pads on the die are electrically connected to the leadframe by wire bonds. A patterned region of removable material is formed over the die where it is desired that a portion of the die be exposed after molding. The die and leadframe are then positioned within the cavity of a mold, and encapsulation material injected into the cavity. The removable material is then removed to produce an encapsulated structure with an exposed region. That is, a structure is produced which is entirely encapsulated in encapsulation material apart from the location blocked by the removable material. Accordingly, the integrally molded structure includes encapsulation material beneath the leadframe (i.e., on the side of the leadframe opposite that to which the die is attached).

In an alternate embodiment of capacitive sensor devices, such as that disclosed in U.S. Pat. No. 6,512,381, which is incorporated herein by reference, a varying voltage electrically drives the fingertip being sensed during the sensing process. The variable two-plate sense capacitor previously described can also be used to provide a variable input charge into more complex capacitive sensor systems based on the sensing of fringing field interference caused by the presence of fingerprint ridges. With the addition of an external electrode to electrically drive the finger with a varying voltage so that the presence or absence of fingerprint ridges act as a variable charge transfer input capacitor to complement the effect the ridges of the fingerprint have in acting to interfere with the fringing field of the sensor capacitor, the sensitivity of the sensor is thereby greatly improved.

In order to drive the user's finger with the desired varying voltage, the finger must be in electrical contact with a voltage source. According to one embodiment, this contact is made by providing a metal bezel around part or all of the perimeter of the sensor. As the user applies a finger to the sensor surface, either by placement on an area sensor or in the swiping motion over a strip sensor, the finger in put into direct contact with the bezel (or in contact with a conductive coating applied over the bezel in manufacturing). The bezel then serves as the contact with the finger for transferring the charge from the finger to the input capacitor of the sensor apparatus.

Traditionally, the metal bezel, the leadframe, and the sensor IC have each been separate elements, brought together in the process of assembling or packaging the sensor apparatus. However, as in the general art of IC production, there is significant, ongoing commercial pressure to reduce cost, number of components, and number and complexity of manufacturing steps, and size of the completed structure. The present invention focuses on the bezel and leadframe to reduce cost, complexity, and size, of the sensor apparatus, simplifying its assembly, etc.

SUMMARY OF THE INVENTION

The present invention is directed to a component for a fingerprint sensor apparatus, the structure of that component, and the method of producing the same. More specifically, one aspect of the present invention is an integrated leadframe and bezel.

According to one aspect of the invention, an integrated leadframe and bezel structure is disclosed. This integrated leadframe and bezel may be stamped, etched, etc. from sheet material such as copper, copper alloy, or the like in a manner similar to that by which known IC leadframes are currently formed. The layout and dimensions of the leadframe are selected such that one or more portions of the leadframe may be bent out of the plane of the sheet to create bezel region(s). This bending may be accomplished by die-stamping or other process for rapid, automated fabrication.

According to another aspect of the present invention, a sensor IC is bonded to a die pad region of the leadframe, and bonding wires applied between bonding pads on the sensor IC and lead tips of the leadframe. In so doing, the plane of the bezel regions is made parallel to or slightly above the plane of the upper surface of the sensor IC. The combined leadframe and bezel structure, bonding wires, and sensor IC are then encapsulated in a non-conductive encapsulation material such that the bezel regions, upper surface of the sensor IC, and leadframe contact pads are all exposed. A completed sensor structure is thereby provided.

According to another aspect of the present invention, two such bezel regions are provided, each electrically isolated from the other. This allows each bezel to then be provided with its own, isolated contact pad. Each bezel region may then be provide with different potentials (and/or potentials varying at different rates), permitting different regions of the finger of a user to be provided with different potentials at any one time and throughout a single application of a finger.

According to a yet further aspect of the present invention, the bezel region(s) is formed to have a resiliently deformable support. Once bent into position, the bezel may then move up and down relative to the upper surface of the sensor IC mounted to the die pad of the leadframe. The relative positions of the planes of the bezel and the upper surface of the sensor IC may then be controlled, for example with the upper surface of the sensor IC as the reference plane and the bezel moving up or down relative thereto, to obtain the desired displacement between the two planes. This provides control over the relative area and/or force applied by a fingertip as between the bezel and the sensor IC.

According to a still further aspect of the present invention, the bezel region(s) is at least as wide as the width of the sensor structure formed in the sensor IC. Contact area between the user's finger and the bezel surface is therefor maximized without increasing the size of the overall package.

According to yet another aspect of the present invention, regions of the integrated leadframe and bezel may be selectively plated, for example to enhance conductivity, provide environmental protection, etc. In one embodiment, the bezel region(s) are plated, for example with Ni—Sn, so as to provide a conductive surface with enhanced resistance to wear, corrosion, etc. due to the exposure of the bezel region(s) to atmosphere, friction (finger swipe), oils (from the fingertip), etc.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings:

FIG. 3A is a side, or elevation view of the template for an integrated leadframe and bezel structure of FIG. 1.

FIG. 3B is a side, or elevation view of the template for an integrated leadframe and bezel structure of FIG. 2.

FIGS. 3C and 3D are variations of the embodiment of the template for an integrated leadframe and bezel structure of FIG. 2.

DETAILED DESCRIPTION OF THE INVENTION

Figure 1:
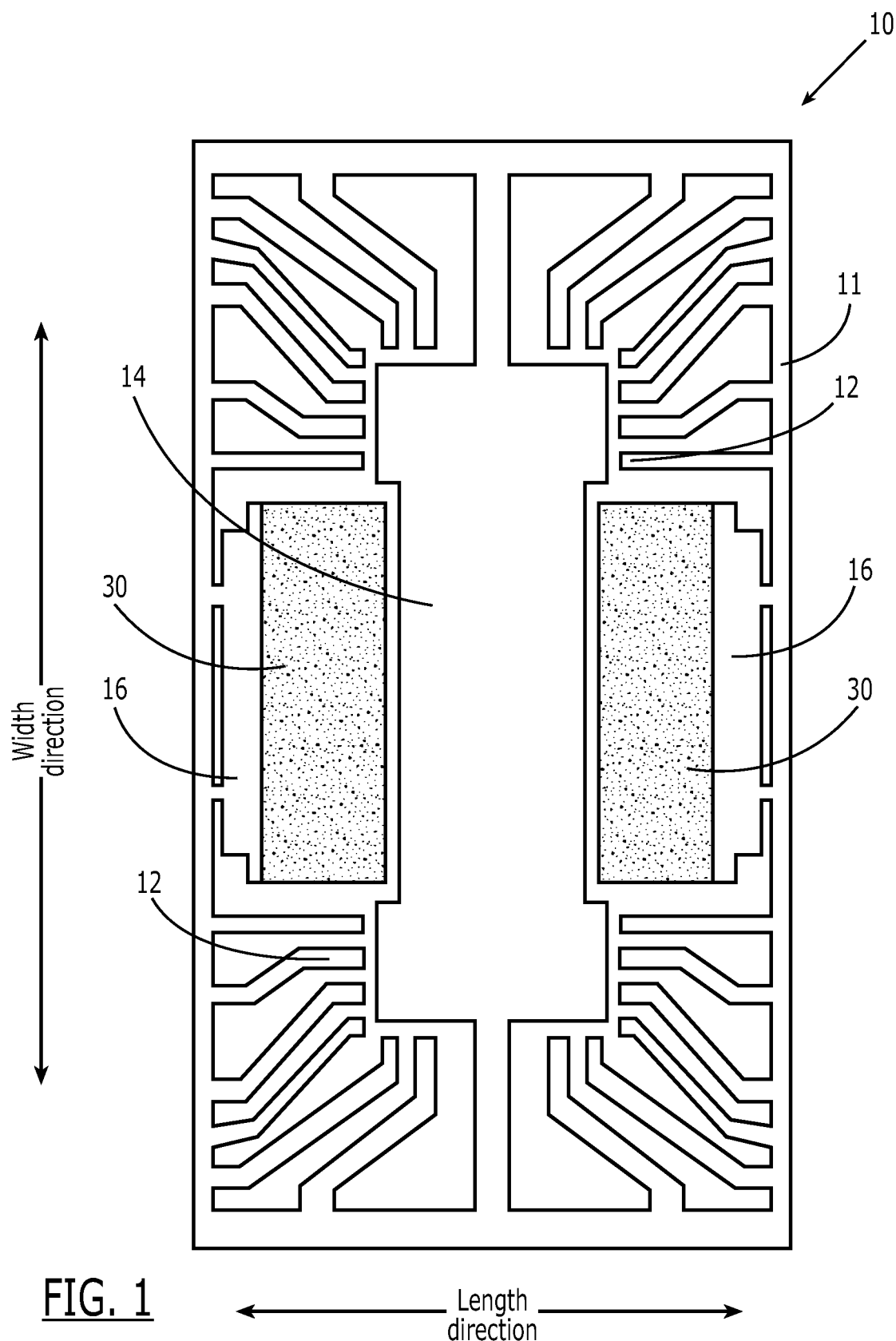
FIG. 1 is a plan view of a template for an integrated leadframe and bezel structure, according to an embodiment of the present invention.

According to a first embodiment of the present invention, a template of integrated leadframe and bezel is provided for an integrated leadframe and bezel 10, as illustrated in FIG. 1. The template may, in some embodiments, represents a unit detail (the design) of a leadframe structure, in other embodiments the artwork used to pattern and etch sheet material to form a leadframe, in still other embodiments the die or other tool carrying the leadframe design used to form a leadframe, and in still further embodiments the leadframe structure itself. Thus, by definition, template as used herein is intended to cover both the design of a leadframe and the leadframe itself, as well as the tools carrying the design and used to produce the leadframe.

Integrated leadframe and bezel 10 includes a carrier frame 11. Physically and electrically connected to said carrier frame 11 are a number of bonding leads 12, a die pad region 14, and bezel regions 16, each described further below. Importantly, the number and position of such features may vary depending upon the application of the present invention, and accordingly, the present invention shall not be interpreted as being limited to the number and position of features shown in FIG. 1.

The template for integrated leadframe and bezel 10 represents the outline of a planar structure formed from sheet material. The material may be copper, an copper alloy, or other appropriate material such as that known for existing IC leadframe structures. The integrated leadframe and bezel may be die stamped, etched, or formed by other means known in the art.

Figure 2:
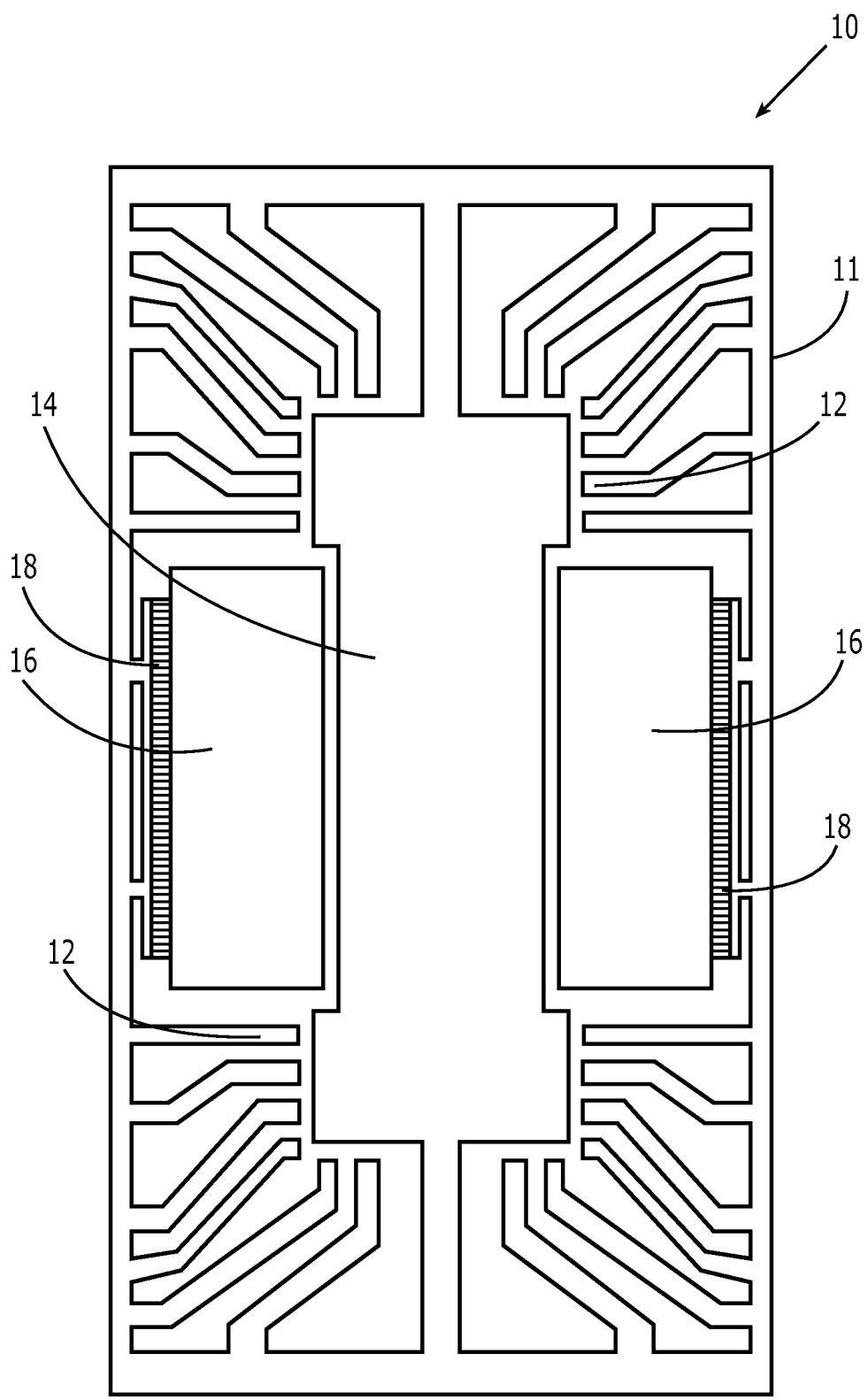
FIG. 2 is a plan view of the template for an integrated leadframe and bezel structure of FIG. 1 in which bezel portions have been bent out of the plane of the carrier frame.

According to another embodiment of the present invention, an integrated leadframe and bezel are manufactured such that bezel regions are formed then bent out of plane relative to the leadframe, as illustrated in FIG. 2 and in FIGS. 3A and 3B. The integrated leadframe and bezel is formed with bending portions 18 which permit the bezel to be bent out of plane. These regions are described further below. Bezel regions 16 may be bent out of the plane of the leadframe by press-and-die, or other methods known in the art. It will be understood that formation of the integrated leadframe and bezel according to the present invention is well suited to mass production techniques. Therefore, a high-speed, repeatable process such as computer controlled press-and-die or the like are preferred in many applications of the present invention.

With reference now to FIGS. 3A through 3D, several embodiments of an integrated leadframe and bezel are shown in profile view. FIG. 3A shows a leadframe and bezel 10 with the bezel regions in plane with the remainder of the leadframe. Optionally, prior to further processing, a protective and aesthetic coating may be applied over the surface of carrier frame 11, bonding leads 12, and bezel regions 16, or selectively over bezel regions 16, in order to provide protection, wearability, and/or an enhanced appearance of the bezel regions when exposed in the final IC package. Examples of materials used for such a coating include nickel-tin (NiSn), nickel-palladium (NiPd), silver (Ag), etc.

FIG. 3B shows a first embodiment of the present invention in which bezel regions 16 have been bent along bending portions 18 so that portions of the bezel regions 16 are out of plane with reference to the plane of the remainder of the leadframe.

Ultimately, the integrated leadframe and bezel will be mated to a sensor IC, bonding wires formed to connect bonding pads on the sensor IC with bonding leads 12, and this complete assembly encapsulated in an appropriate material such that the sensing surface for the sensor IC and the bezel regions are exposed. In use, a user will typically swipe a finger over and in contact with the structure, including the exposed sensing surface for the sensor IC and the bezel regions. To facilitate a smooth swipe of the finger, and to avoid damage and reduce wear on the assembly, it may be desirable to radius the inner edge 17 and outer edge 19 of the bezel regions, as illustrated in FIG. 3C. This may be accomplished as part of the initial bending of the bezel regions or may be done in a separate step. Again, press-and-die or similar production techniques may be employed to form the radiuses. Alternatively, or in addition to providing a radius at edges 17, 19, the entire out-of-plane portion of the bezel regions 16 may be formed to have a concave or an arched cross-section, for example a circular arch of radius r, or similar curvature as illustrated in FIG. 3D. Again, this may be accomplished as part of the initial bending of the bezel regions or may be done in a separate step, and may be accomplished by press-and-die or similar production techniques. The highest point of the arch, or the arch apex, would represent a tactile surface for a user, providing a physical indication that the finger is in the proper position relative to the sensing surface for and bezels for sensing.

Figure 4A:
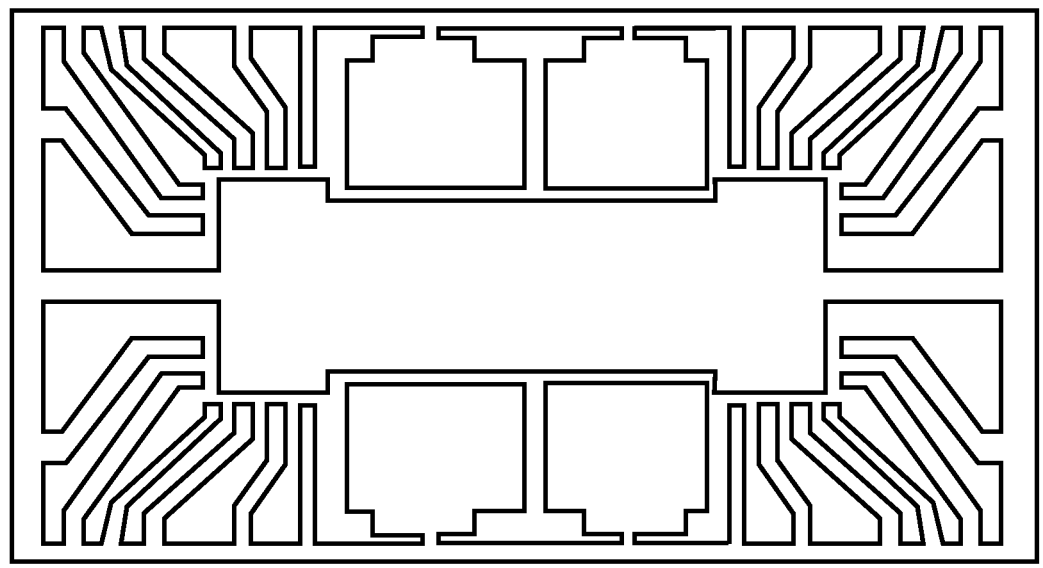
FIGS. 4A and 4B are plan views of variations of the embodiment of the template for an integrated leadframe and bezel structure of FIG. 1.
Figure 4B:
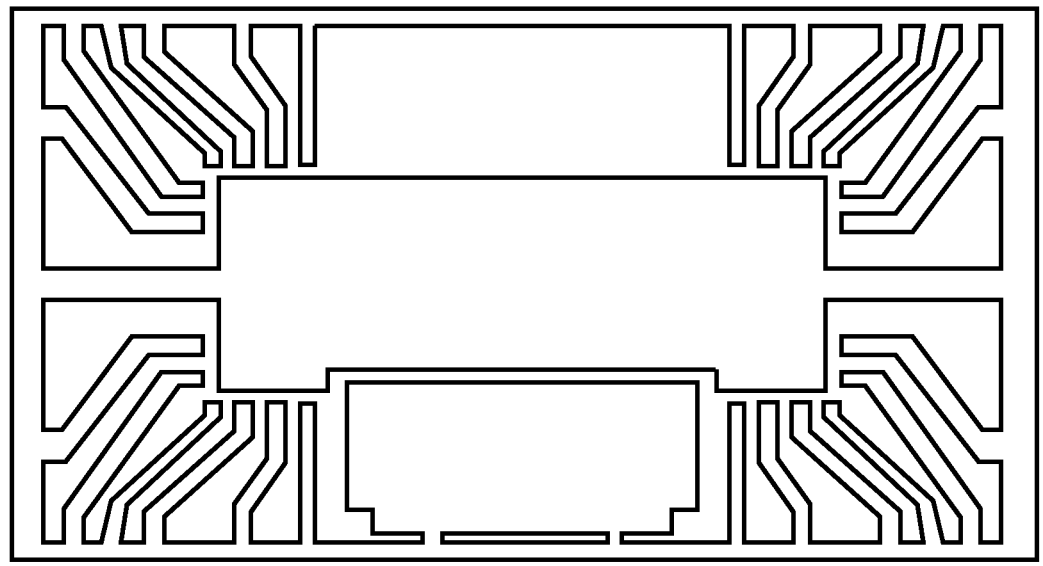

It will be appreciated that while two bezel regions 16 have been shown in FIGS. 1 through 3D, the exact same design principles and functionality may be provided with more or less than two such regions. For example, FIG. 4A illustrates a similar arrangement with a single bezel region 16, and FIG. 4B illustrates a similar arrangement with 4 bezel regions. Therefore, many different variations in the configuration of the integrated leadframe and bezel structure are possible and within the scope of the present disclosure.

Figure 5:
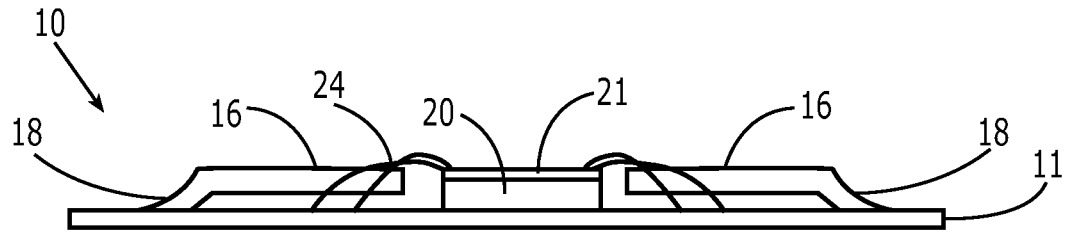
FIG. 5 is a side, or elevation view of an integrated leadframe and bezel structure together with a sensor IC and wire bonds, according to an embodiment of the present invention.

With reference next to FIG. 5, there is shown therein a profile view of integrated leadframe and bezel 10 mated with a sensor IC 20. Also with reference to FIG. 6, there is shown therein a plan view of the integrated leadframe and bezel 10 mated with a sensor IC 20 of FIG. 5. Sensor IC 20 is attached to die pad region 14, for example with an epoxy or similar adhesive. Sensor IC 20 is provided with a number of bonding pads 22 for making electrical connection to external devices and systems.

In order to make electrical connection between bonding pads 22 and bonding leads 12, a fine wire is connected between the two, for example by a wire bonding machine. Typically, the assembly of integrated leadframe and bezel 10 with sensor IC 20 secured thereto is indexed to a wire bond head in the wire bonding machine and positioned. The exact die position is, in some processes, found by pattern recognition techniques. Gold or other conductive wire 24 is then extended between and attached to the bonding pads 22 and bonding leads 12. The number of wire bond connections are made in accordance with the design of the IC die. Bonding pads 22 and/or bonding leads 12 may be pre-soldered to facilitate the wire attachment step. Soldering processes for making the bonding wire connections between bonding pad 22 and bonding lead 12 are well known in the art.

Formed in sensor IC 20 will be one form of sensor structure 26, depending on the type of sensor being employed. In one embodiment, sensor structure 26 comprises a capacitive strip sensor. This type of sensor has a relatively compressed range of sensitivity, meaning that a fingertip must be very close to the top surface of the sensor plates embedded within the sensor IC for acceptable results. A typical sensor IC will be comprised of a silicon or similar body, having a sensor structure 26 formed by photolithographic or similar process, and a topmost hard protective layer, such as a silicon nitride passivation layer 21 which lies on top of and protects the sensor plates. Additionally, the sensor plates may be further protected by additional protective layers such as polyamide, epoxy, or even the formation of a thin layer of protective encapsulation material formed as part of the packaging process (molding). The top surface of the sensor IC 20, i.e., the top surface of the passivation layer, or whatever uppermost surface is formed by the ultimate protective layer, forms the sensing surface, S. The sensing surface S lies above the surface of the sensor plates by an amount corresponding to the thickness of the topmost hard protective layer (i.e., passivation layer) plus any additional protective layers which have been applied (including any protective layer formed as part of the packaging process) and the fingertip must be on or proximate the sensing surface S in order that its fingerprint pattern can be sensed. However, as previously explained, in one embodiment of such a sensor structure it is desirable to drive the finger with a varying voltage as it is being sensed in order to improve sensor performance. Bezel regions 16 serve as contacts with the fingertip for the purpose of driving the finger with that voltage. Therefore, the fingertip must simultaneously be in contact with both a bezel region 16 and be on or proximate the sensing surface S. This means that the plane of the sensing surface S and the bezel regions 16 must ultimately be separated in height by at most a small amount so that a fingertip swiped over and in contact with one is not prevented from being in contact with the other. Preferably, a portion of bezel regions 16 is no more than 200 microns (μm) above nor 200 microns (μm) or below the sensing surface S.

As will be described further below, according to one embodiment of the present invention, in the packaging process the integrated leadframe and bezel, the sensor IC secured thereto, and the bond wires electrically connecting the two are encapsulated in a encapsulation material, with the bezel and sensing surface S exposed. During the packaging process, a relatively thin layer of protective material, such as the encapsulating material, or other overcoat may optionally be applied over the die surface of the sensor IC 20 and sensor structure 26. In this case, the packaging process itself will form the outermost protective layer and thereby will form the ultimate sensing surface for sensor IC 20 as a result. In the description which follows, unless specified to the contrary, the thin additional protective layers (overcoat) beyond the hard protective coating (passivation) which is typical in IC manufacturing may be present or not and may be applied at the wafer level, prior to packaging, or as a result of the packaging process without departing from the scope of the claimed invention.

Figure 7A:
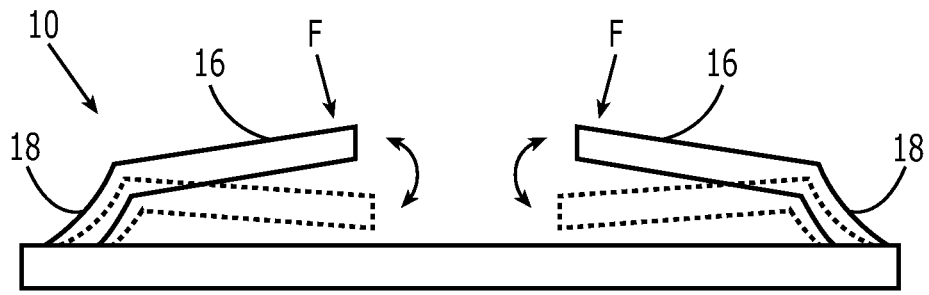
FIGS. 7A through 7C are illustrations of using the flexibility of the bending portion of the bezel structures to achieve alignment of the upper extent of the bezel portions and the plane of the upper surface of the sensor IC according to an embodiment of the present invention.

The process of aligning the bezel regions and the sensing surface S for molding may be facilitated by providing the bending portions 18 with a certain degree of spring resiliency. This is illustrated with reference to FIGS. 7A through 7C. With reference first to FIG. 7A, it will be seen that bezel regions 16 are fixed only at the ends thereof at which bending portions 18 are located. This permits the opposite end to flex, or rotate, around the point of attachment to the leadframe at bending portions 18. Effectively, an application of force at the ends of the out-of-plane portions of bezel regions 16 identified by the letter F produces a moment which is resisted by the spring constant of the bezel regions 16 and bending portion 18. The type of material forming integrated leadframe and bezel 10, the thickness of integrated leadframe and bezel 10, and the dimensions of bezel regions 16 and bending portion 18 are elements which determine the spring constant.

Figure 7B:
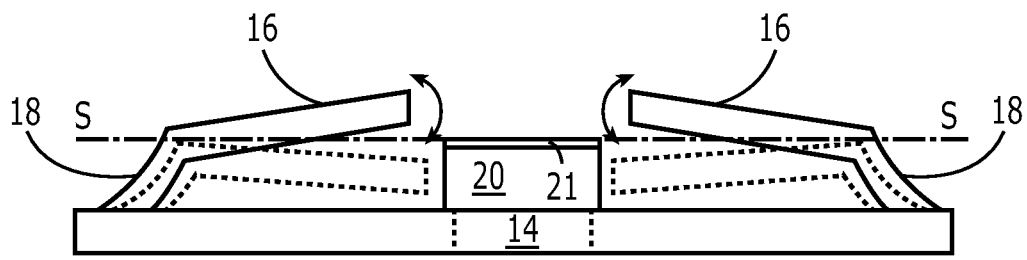
Figure 7C:
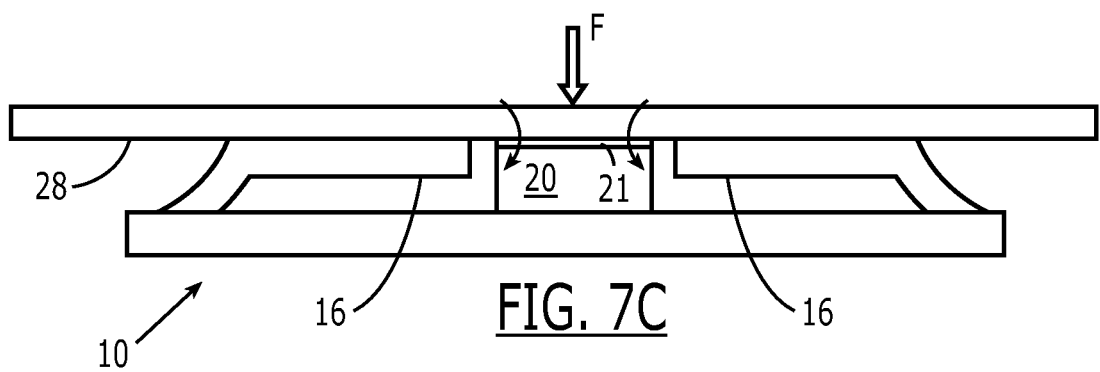

With reference to FIGS. 7B and 7C, when a surface, such as the upper mold surface 28 of the encapsulation mold is brought into contact with the upper surfaces of bezel regions 16, the force F is applied against the spring constant. Surface 28 may be positioned to be in contact with the outermost protective surface of sensor IC 20. Thus, the bezel regions 16 are compressed and thereby essentially brought into the plane of sensing surface S, and bezel regions 16 may then be held in place for subsequent encapsulation.

Figure 8:
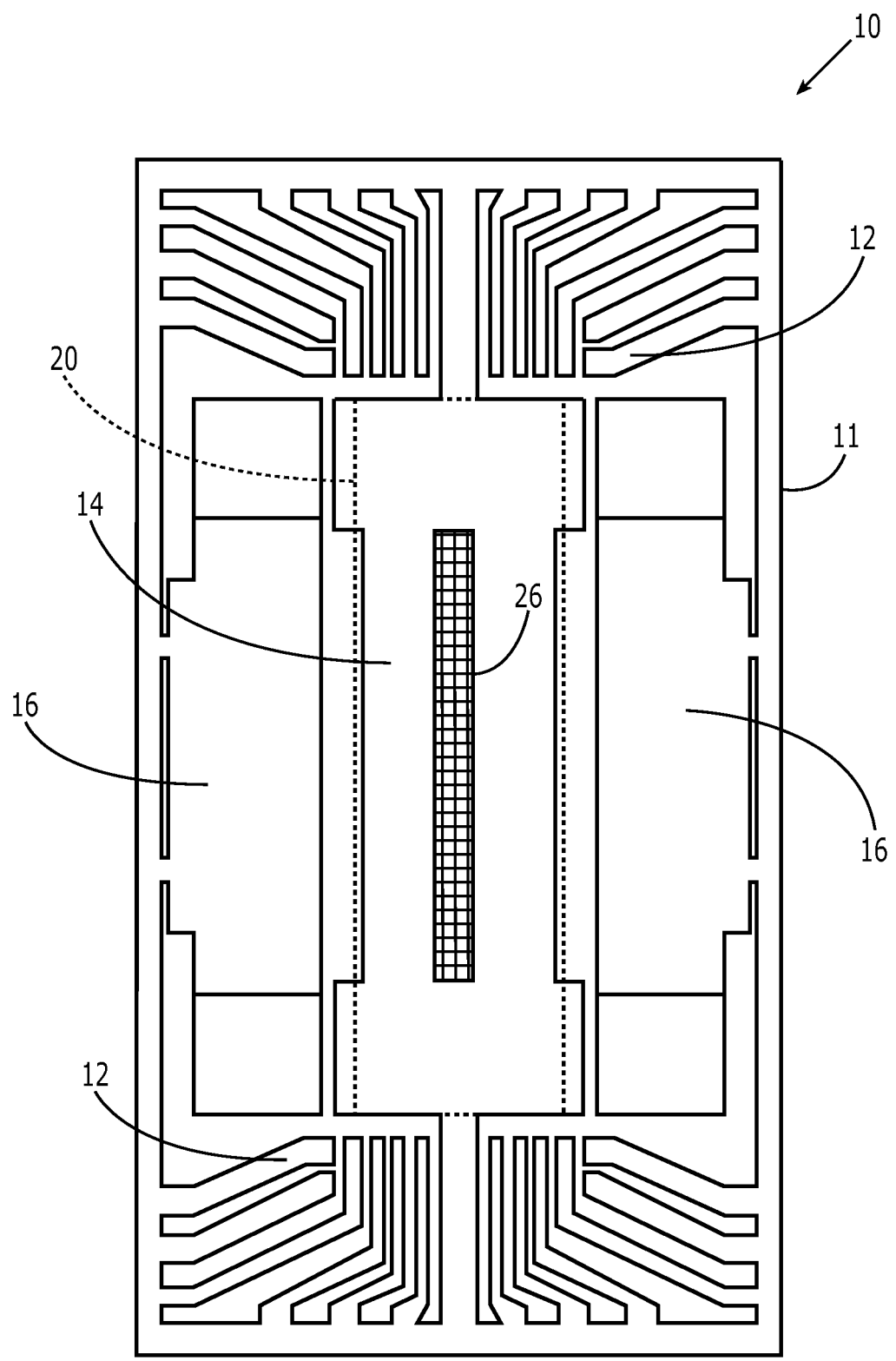
FIG. 8 is a plan view of another embodiment of the template for an integrated leadframe and bezel structure according to the present invention.

With reference again to FIG. 1, it will be noted that the bezel regions 16 are not as wide (in an axial direction) as the die pad region 14. This provides an area at the edges of the integrated leadframe and bezel 10 for making connections between the bonding pads on the sensor IC and the bonding leads of the leadframe. In a variation of these embodiments described above, bezel regions 16 extend to at least the full width of bonding pad region 14, as illustrated in FIG. 8. Many other arrangements are possible, keeping in mind that accommodation must be made for making the wire bonds between bonding pads on the sensor IC 20 and the bonding leads 12. It should be noted that while not always the case, typically these bonds will be made after the bending of bezel regions 16 out of the plane of integrated leadframe and bezel 10. Thus, accommodation must also be made for the apparatus which applies the wire bonds, such as a robotic bonding tool to access the bonding leads 12.

As noted above, in use a section of the out-of-plane portion of bezel regions 16 will be both exposed to the environment and subject to physical contact with user fingertips, etc. Such exposure tends to result in accumulation of contaminants, oils, and other materials which may corrode the bezel regions, interfere with conductivity between the bezel region and a user's fingertip, etc. In use, the bezel regions are also subjected to physical wear. And indeed, the bezel regions are visible to a user. Therefore, as previously discussed, according to a variation of the embodiment described above, a conductive protective and aesthetic coating 30 may be selectively applied to the integrated leadframe and bezel 10, or selective portions thereof, as illustrated in FIG. 1.

Figure 6:
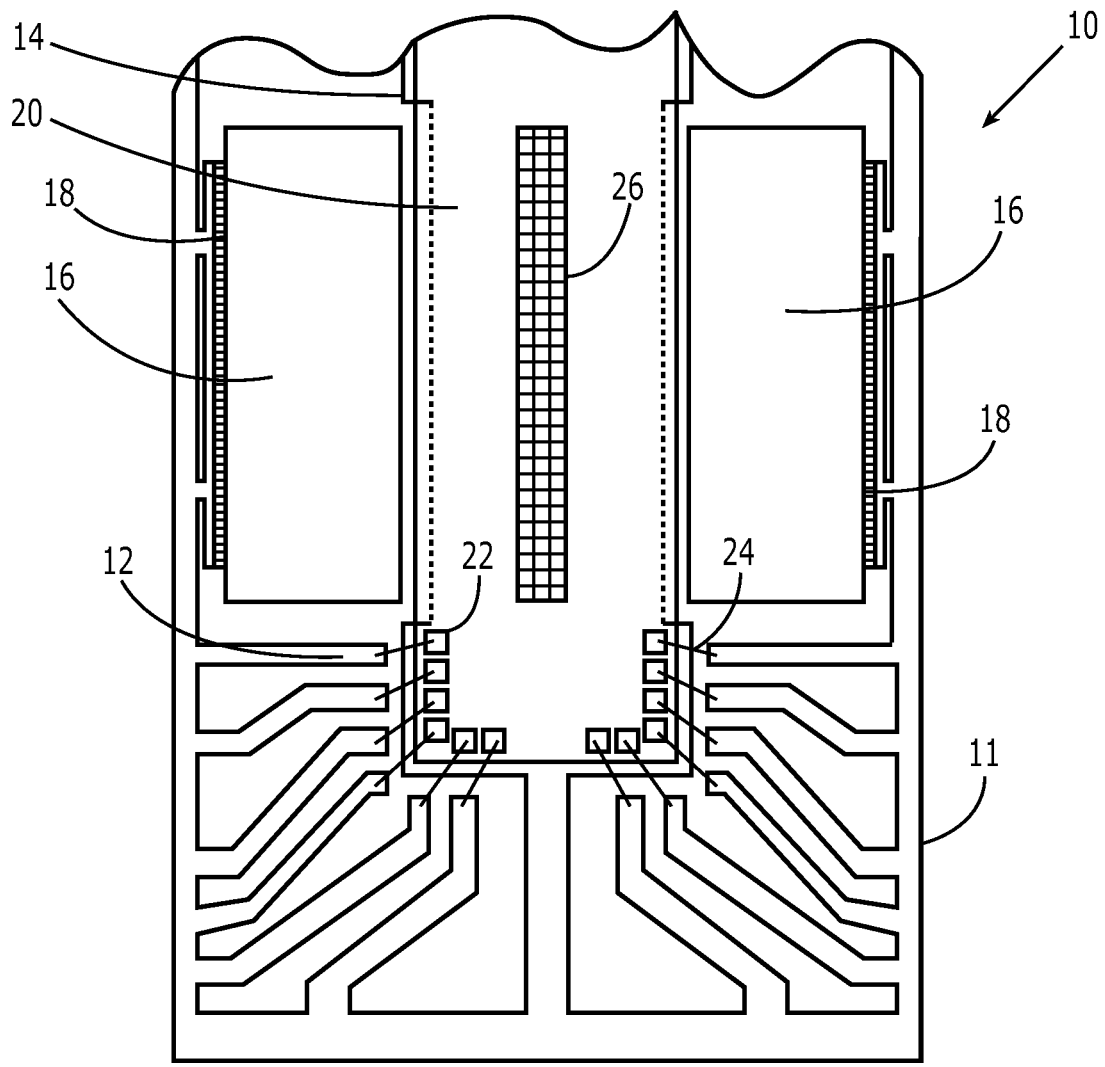
FIG. 6 is a plan view of an integrated leadframe and bezel structure together with a sensor IC and wire bonds, according to an embodiment of the present invention.

With reference to FIG. 6, in order to protect the wire bonds 24 and the sensor IC 20, and to provide a substrate to carry contact pads to connect the sensor IC to external circuitry, portions of the assembly of the integrated leadframe and bezel 10, sensor IC 20, and wire bonds 24 are encapsulated in a molded body, typically with the portions of leads 12 extending outside the body.

Figure 9:
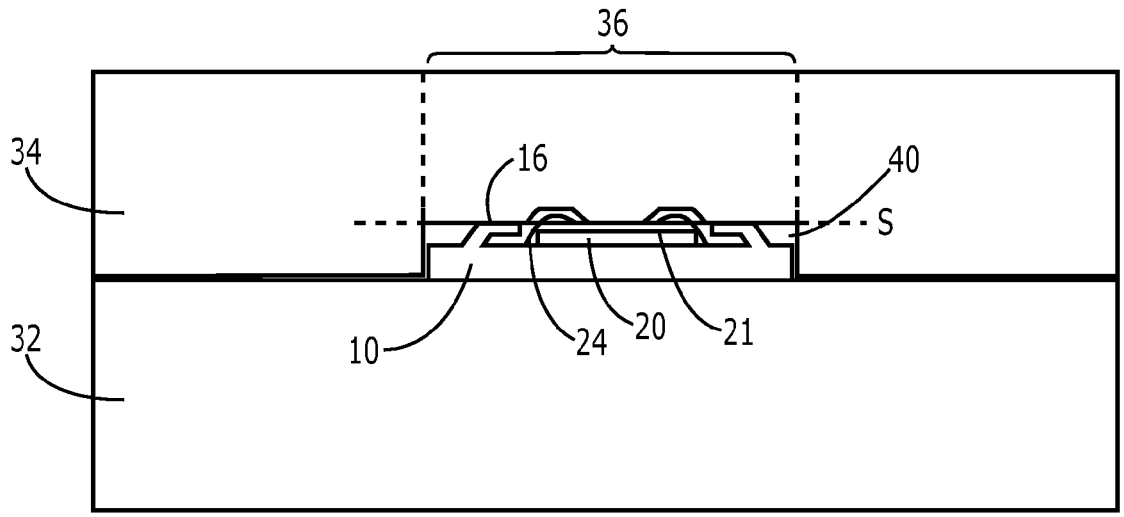
FIG. 9 is a side, or elevation view of a mold for encapsulating an integrated leadframe and bezel structure together with a sensor IC and wire bonds, according to an embodiment of the present invention.

With reference to FIG. 9, wire bonded integrated leadframe and bezel 10 is loaded into a molding machine between mold cavities 32, 34. Bottom mold half 32 and top mold half 34 are shaped to provide a specific mold profile. According to one embodiment of the present invention, top half mold 34 provides regions for receiving encapsulation material to encase the wire bonds 24 and a portion of the leads 12 (shown in FIG. 11), but prevent the encapsulation material from encapsulating a portion of the sensing surface S and portions of bezel regions 16.

Figure 10:
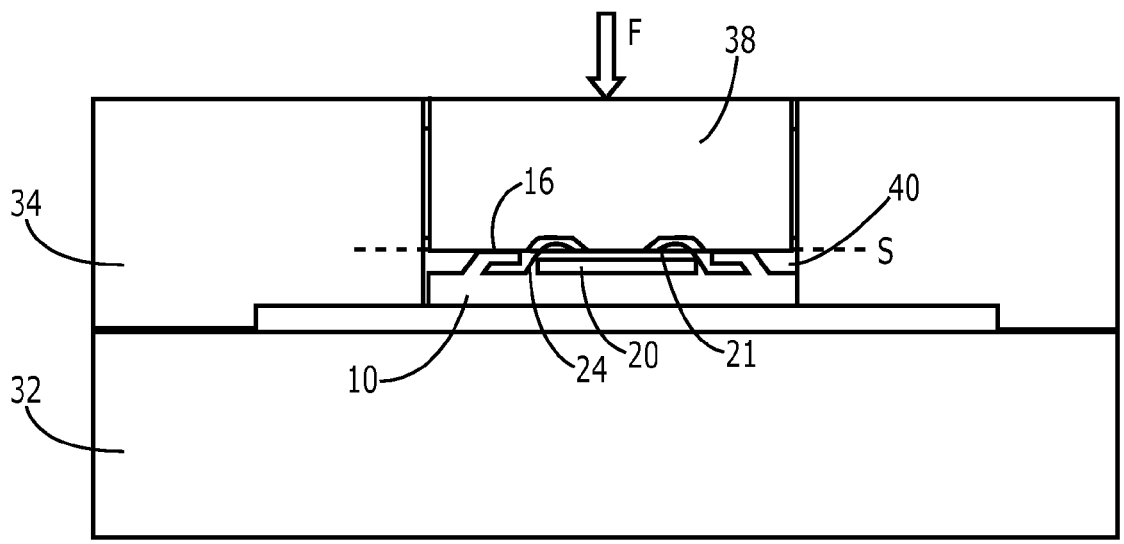
FIG. 10 is a side, or elevation view of a mold for encapsulating an integrated leadframe and bezel structure together with a sensor IC and wire bonds, according to another embodiment of the present invention.

According to one embodiment, top half mold 34 is shaped to provide a blocking region 36, which overlays a desired portion of sensor IC 20 and bezel regions 16 to thereby prevent encapsulation material from forming thereover. According to other embodiments, other methods are employed to prevent encapsulation material from forming over the sensing surface S and bezel regions 16. One such other method, illustrated in FIG. 10, includes a sliding piston 38 and load F, or similar molding element for applying a surface of the molding element, movable independent of top half mold 34, into contact with the desired portion of the sensing surface S and bezel regions 16. Other embodiments, not shown, include a plastic-film covered piston or other blocking mechanism in place of piston 38.

In the previously described embodiment, the goal was to provide complete blocking of encapsulation material over at least a portion of the sensing surface S and bezel regions 16 such that those regions were exposed in the final device. However, in variations of those embodiments it may be desirable to provide a thin layer of encapsulation material over at least the top surface of sensor IC 20 to form an outermost protective layer to further protect the silicon surface from the environment, wear, etc. While not shown, this embodiment may be obtained by stopping top half mold 34, piston 38, etc., just short of the top surface of sensor IC 20 (but in contact with portions of bezel regions 16), providing a very thin (25-50 µm) opening into which encapsulation material may be introduced. Encapsulation material entering this thin opening forms a thin additional protective coating over the sensor IC 20 in the completed device—thereby forming the outermost protective layer and hence the final sensing surface for the device. In this case, the encapsulating layer forming the sensing surface must be thin enough to permit the operation of the sensor while thick enough to provide mechanical protection of the silicon or other material forming the sensor within sensor IC 20. Such protective layers of encapsulating material must be tightly controlled to be uniform at a thickness of no more than 50 µm or so, as distinguished from typical IC packaging processes which have no requirement for sensing through the encapsulation material and typically result in encapsulation layers of 500 µm or more over the entire surface of the silicon die.

In each of the above embodiments, once the assembly of integrated leadframe and bezel 10, sensor IC 20, and wire bonds 24 are appropriately clamped within mold halves 32, 34, encapsulation material is introduced into cavities such as 40 formed by mold halves 32, 34. The epoxy is hardened and the mold opened, releasing the packaged IC structure. Excess encapsulation material is removed leaving each IC die completely encapsulated with encapsulation material on its top, bottom, and 4 sides, electrically connected to leads 12, and attached to the leadframe at the die pad. The encapsulated IC die may then be placed into an oven for final curing of the encapsulation material. Optionally, the material encapsulating the IC may then be marked by ink, laser, etc.

While varying depending on the process employed, the leads 12 are typically isolated by singulating (sawing or punching) the encapsulated die and a portion of the leadframe. The singulated encapsulated IC die is now referred to as a packaged IC. As is well known, contact pads are exposed on the bottom surface of the packaged IC as a part of the molding process. The final packaged IC is obtained having an exposed or thinly covered sensor structure and exposed portions of bezel regions on its top surface, and exposed contact pads on its bottom surface.

Figure 11:
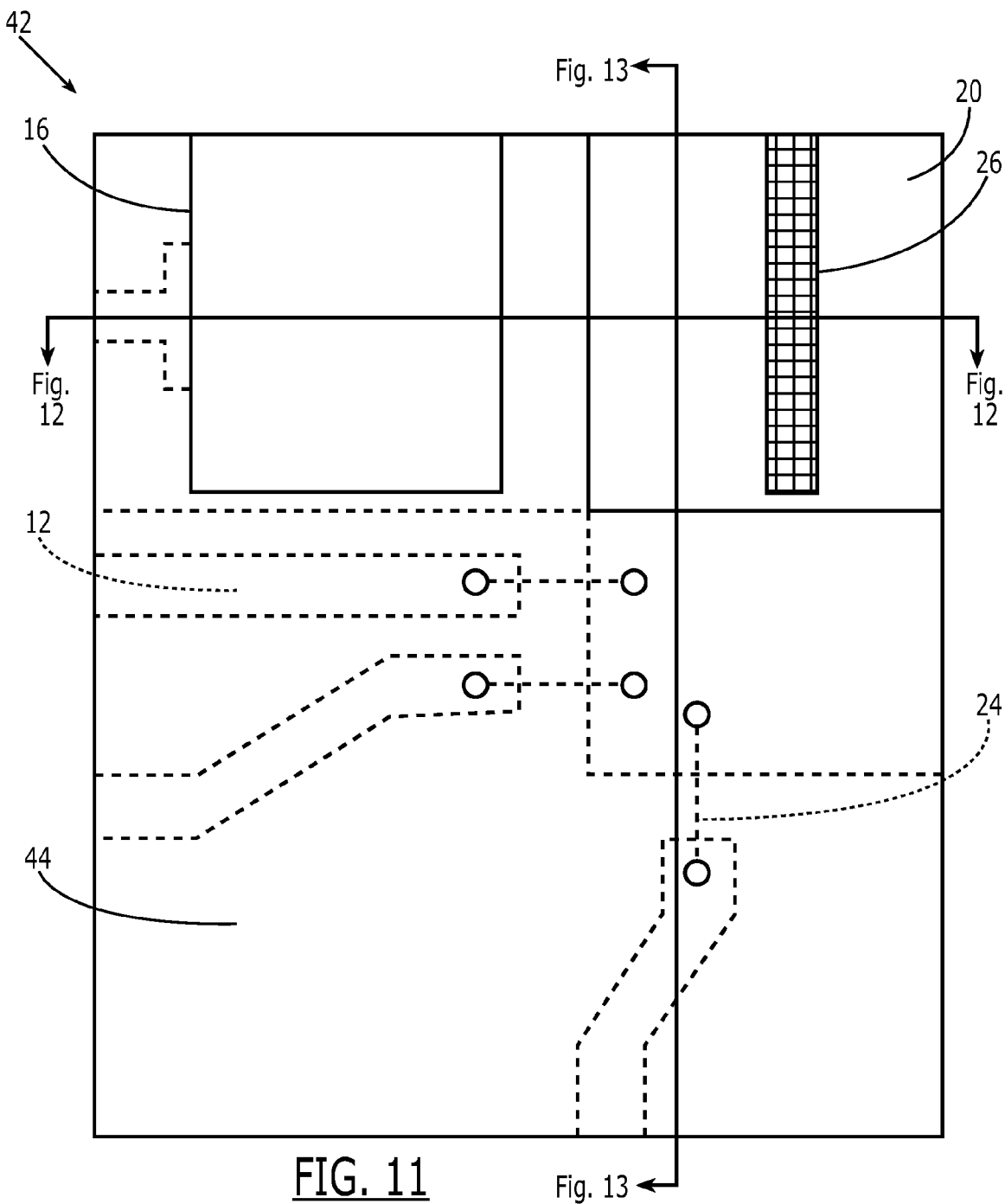
FIG. 11 is a plan view of a portion of an encapsulated integrated leadframe and bezel structure together with a sensor IC and wire bonds, according to an embodiment of the present invention.
Figure 12:
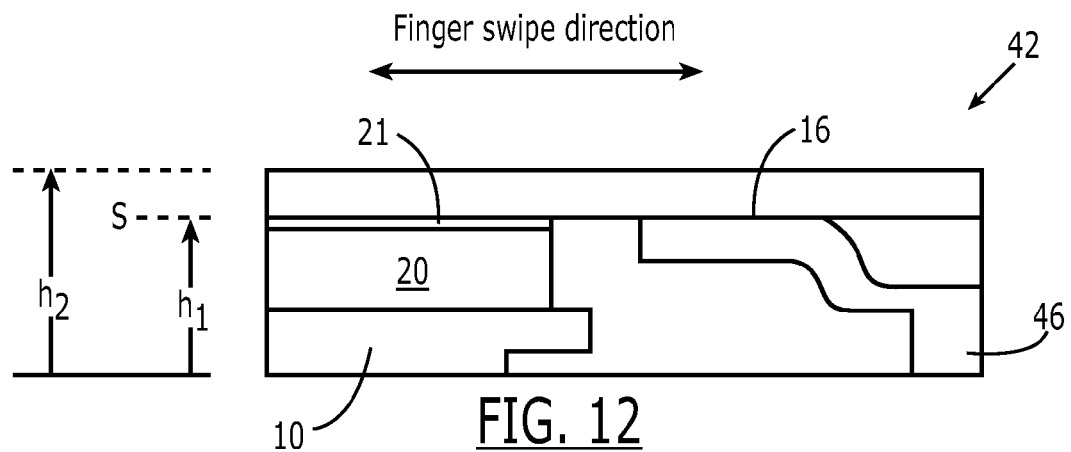
FIGS. 12 and 13 are side, or elevation views of the encapsulated integrated leadframe and bezel structure together with a sensor IC and wire bonds of FIG. 11.
Figure 13:
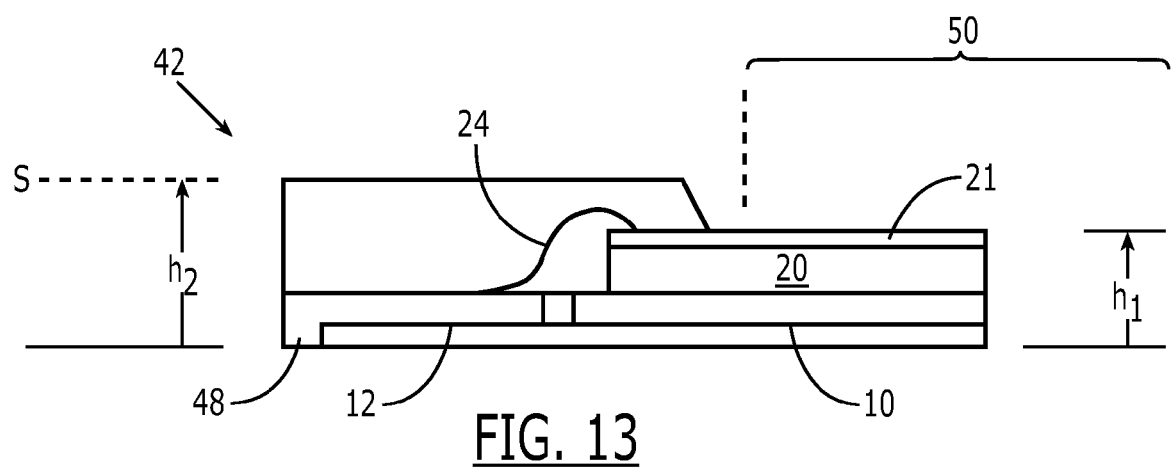

The final structure of the packaged IC according to the present invention is noteworthy for its combination of an exposed, or thinly covered sensor IC surface together with exposed portions of bezel regions aligned in or controllably spaced above or below the sensing surface S. Such a structure 42 is illustrated in FIGS. 11 through 13. FIG. 11 is a top view of final structure 42, showing encapsulation material 44, and exposed sensor surface atop sensor IC 20, and exposed portion of bezel region 16. Located inside encapsulation material are bonding leads 12, wire bonds 24, and a portion of sensor IC 20.

FIG. 12 is a first cut-away profile view of final structure 42, illustrating a portion of sensor IC 20, integrated leadframe and bezel 10, bezel regions 16, and a contact pad 46 for making an external connection to bezel regions 16. Also illustrated is one aspect of this embodiment in which the encapsulation material is formed to have two separate heights. A first portion through which the bezel regions 16 and Sensing surface S are exposed has a height $h_1$.

With reference to FIG. 13, which is a second cut-away profile view of final structure 42, illustrating a portion of sensor IC 20, integrated leadframe and bezel 10, wire bond 24, bonding lead 12, and a contact pad 48 for making an external connection to bonding lead 12, it can be seen that a second portion encapsulating wire bonds 24 has a height $h_2$. In order to assist with visualizing these views, it will be noted that a fingertip would be applied over region 50 for sensing.

Figure 14:
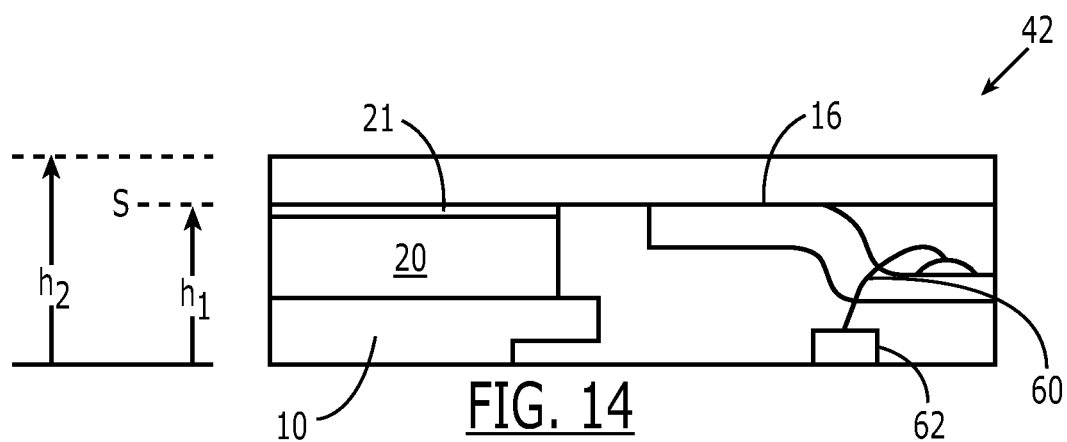
FIG. 14 is a variation of the embodiment shown in FIG. 12, in which external contact to the bezel portion may be by a contact pad which is not an integral part of the bezel portion itself.

According to a variation of the above embodiments, shown in FIG. 14, in place of contact pad 46 which is shown as an integral part of bezel regions 16, a wire bond 60 may be applied to connect bezel region 16 and a separate contact 62. Wire bond 60 would be fully encapsulated in accordance with the above description.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation, dimension, ratio or the like in the description of the present invention or its claims can or should be read as absolute. The limitations of the claims are intended to define the boundaries of the present invention, up to and including those limitations. To further highlight this, the term "substantially" may occasionally be used herein in association with a claim limitation (although consideration for variations and imperfections is not restricted to only those limitations used with that term). While as difficult to precisely define as the limitations of the present invention themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. For example, while a single cell has been described for the various embodiments herein, it will be appreciated that the present invention may find application, in certain cases with some modifications, to volume manufacturing processes, in which multiple cells are processed in parallel or serially in rapid succession. Therefore, the foregoing detailed description provides those of ordinary skill in the art with a convenient guide for implementation of the invention, and contemplates that various changes in the functions and arrangements of the described embodiments may be made without departing from the spirit and scope of the invention defined by the claims thereto.

What is claimed is:

1. A template for an integrated leadframe and bezel structure, comprising:
   a die pad region for receiving a sensor IC die carrying a sensor structure;
   a plurality of bonding lead regions, each bonding lead region having an inner tip portion and an outer contact portion, said bonding lead regions oriented such that the inner tip portion thereof is proximate said die pad region; and
   a first bezel region including a first bending portion, shaped and disposed to facilitate controlled bending of a portion of a structure formed in said first bezel region from a position in a plane of structures formed in said bonding lead and die pad regions to a position out of said plane.

2. The template of claim 1, wherein said bezel region is of a width which at least equals the width of the sensor structure.

3. The template of claim 1, wherein said first bezel region is disposed proximate a first lateral edge of said die pad region, and further comprising a second bezel region disposed proximate a second lateral edge of said die pad region opposite said first lateral edge of said die pad region, said second bezel region including a second bending portion, shaped and disposed to facilitate controlled bending of a portion of a structure formed in said second bezel region from a position in a plane of structures formed in said bonding lead and die pad regions to a position out of said plane.

4. An integrated leadframe and bezel structure for use in a fingerprint sensing device, comprising:
   a planar carrier frame;
   a plurality of bonding leads physically and electrically connected to said carrier frame, each at a first end thereof, and disposed in the plane of said carrier frame;
   a die pad region physically and electrically connected to said carrier frame, and disposed in the plane of said carrier frame; and
   a bezel structure physically and electrically connected to said carrier frame, said bezel structure including a bending portion shaped and disposed to facilitate a portion of said bezel structure being bent out of the plane of said carrier frame.

5. The integrated leadframe and bezel structure of claim 4, wherein said bezel structure comprises at least two bezel portions, each with its own bending portion, and further where at least a first of said bezel portions is disposed on a first side of said die pad region and a second of said bezel portions is disposed on a second side of said die pad region opposite said first side.

6. The integrated leadframe and bezel structure of claim 4, wherein said bezel structure comprises a bezel portion which is raised above the plane of said carrier frame.

7. The integrated leadframe and bezel structure of claim 6, wherein said bending portion is disposed proximate said carrier frame on a first edge of said bezel portion, and said bezel portion has a second edge proximate said carrier frame and opposite said first edge, and further wherein said second edge is rounded downward toward the plane of said carrier frame.

8. The integrated leadframe and bezel structure of claim 6, wherein said bending portion is disposed proximate said carrier frame on a first edge of said bezel portion, and said bezel portion has a second edge proximate said carrier frame and opposite said first edge, and further wherein said bezel portion has an arched cross-section, said arch extending from said first edge to said second edge, and said arch being concave downward toward the plane of said carrier frame.

9. The integrated leadframe and bezel structure of claim 4, wherein said bezel portion extends to a first width in a first axial direction, and said die pad extends to a second width in a second axial direction substantially parallel to said first axial direction, and further wherein said first width and said second width are substantially the same.

10. The integrated leadframe and bezel structure of claim 4, further comprising a protective coating selectively applied over portions of said integrated leadframe and bezel structure.

11. The integrated leadframe and bezel structure of claim 4, further comprising a sensor IC secured to said die pad region, said sensor IC including a sensor structure formed therein, said sensor structure protected by one or more protective layers to form an uppermost planar surface defining a sensing surface, said sensor IC secured to said die pad region at a lower planar surface of said sensor IC opposite said sensing surface.

12. The integrated leadframe and bezel structure of claim 11, wherein said bezel structure comprises a bezel portion which is bent out of the plane of said carrier frame and thereby raised above the plane of said carrier frame in a direction towards said sensing surface.

13. The integrated leadframe and bezel structure of claim 12, wherein a portion of said bezel portion is no lower than 200 microns below and no higher than 200 microns above said sensing surface.

14. The integrated leadframe and bezel structure of claim 12, wherein said bending portion further acts as a spring such that a force applied to the bezel portion is resisted by said bending portion.

15. The integrated leadframe and bezel structure of claim 12, wherein said sensor IC includes bonding pads for making electrical connection between electrical components formed in said sensor IC and external circuitry, further comprising wire bonds extending between and electrically interconnecting said bonding pads and said bonding leads, and further comprising an electrically insulative encapsulation material substantially encapsulating said bonding leads, said wire bonds, said bezel structure, and said sensor IC with the exception of a contact pad portion of said bonding leads, and an exposed region of said bezel portion.

16. The integrated leadframe and bezel structure of claim 15, wherein said bending portion is disposed proximate said carrier frame on a first edge of said bezel portion, and said bezel portion has a second edge opposite said first edge, and further wherein said second edge is rounded downward toward the plane of said carrier frame.

17. The integrated leadframe and bezel structure of claim 15, wherein said bending portion is disposed proximate said carrier frame on a first edge of said bezel portion, and said bezel portion has a second edge opposite said first edge, and further wherein said bezel portion has an arched cross-section, said arch extending from said first edge to said second edge, and said arch being concave downward toward the plane of said carrier frame, said upper extent being an apex of said arch.

18. The integrated leadframe and bezel structure of claim 15, wherein said bezel portion extends to a first width in a first axial direction, and said sensor structure extends to a second width in a second axial direction substantially parallel to said first axial direction, and further wherein said first width and said second width are substantially the same.

19. The integrated leadframe and bezel structure of claim 12, wherein said encapsulation material substantially encapsulates said bonding leads, said wire bonds, said bezel structure, and said sensor IC with the further exception of a portion of said sensing surface.

20. The integrated leadframe and bezel structure of claim 12, wherein an upper extent of said bezel portion is raised above the plane of said carrier frame such that said upper extent of said bezel portion extends above said sensing surface.

21. The integrated leadframe and bezel structure of claim 12, wherein said bezel structure comprises at least two bezel portions, each with its own bending portion, and further wherein at least a first of said bezel portions is disposed on a first side of said die pad region and a second of said bezel portions is disposed on a second side of said die pad region opposite said first side, each said bezel portion raised above the plane of said carrier frame such that said bezel portions extend at least to said sensing surface, said first of said bezel portions disposed on a first side of said sensor IC and said second of said bezel portions disposed on a second side of said sensor IC opposite said first side.

22. A fingerprint sensor device, comprising:
a bonding pad;
a sensor IC including a sensor structure formed therein at or proximate a planar upper surface thereof, said sensor IC secured to said die pad, said sensor IC further including bonding pads for making electrical connection between electrical components formed in said sensor IC and external circuitry, said sensor structure being protected by one or more protective layers to form an uppermost planar surface defining a sensing surface;
a plurality of bonding leads extending in a plane laterally outward from said sensor IC;
wire bonds extending between and electrically interconnecting said bonding pads and said bonding leads;
a bezel structure comprising bending portions and bezel portions, said bezel portions having a first edge proximate said sensor IC and a second edge, at which is located said bending portions, opposite said first edge, said bezel portions raised above the plane of said bonding leads such that an upper extent of said bezel portions extend toward said sensing surface, and said bending portions extending down to the plane of said bonding leads; and
electrically insulative encapsulation material substantially encapsulating said bonding leads, said wire bonds, said bezel structure, and said sensor IC with the exception of a contact pad portion of said bonding leads, said sensing surface, and said upper extent of said bezel portion.

23. The fingerprint sensor device of claim 22, wherein said upper extent of said bezel portions is raised above the plane of said bonding leads such that said upper extent of said bezel portions extends above said sensing surface.

24. The integrated leadframe and bezel structure of claim 18, wherein said upper extent of said bezel portions is raised above the plane of said bonding leads such that said upper extent of said bezel portions is no lower than 200 microns below and no higher than 200 microns above said sensing surface.

25. The fingerprint sensor device of claim 22, wherein said bezel structure comprises at least two bezel portions, each with its own bending portion, and further wherein at least a first of said bezel portions is disposed on one side of said sensor IC and a second of said bezel portions is disposed on a second side of said sensor IC opposite said first side, such that a fingertip swept across the sensing surface may simultaneously be in physical contact with at least said upper extent of said first and second bezel portions.

26. The fingerprint sensor device of claim 22, wherein said bezel portions extend to a first width in a first axial direction, and said sensor structure extends to a second width in a second axial direction substantially parallel to said first axial direction, and further wherein said first width and said second width are at least substantially the same.

27. The fingerprint sensor device of claim 22, wherein said bezel portions extend to a first width in a first axial direction, and said sensor structure extends to a second width in a second axial direction substantially parallel to said first axial direction, and further wherein said second width exceeds said first width.

* * * * *